United States Patent [19]

Kreider

[11] Patent Number: 5,474,619
[45] Date of Patent: Dec. 12, 1995

[54] THIN FILM HIGH TEMPERATURE SILICIDE THERMOCOUPLES

[75] Inventor: Kenneth G. Kreider, Potomac, Md.

[73] Assignee: The United States of America as represented by the Secretary of Commerce, Washington, D.C.

[21] Appl. No.: 237,888

[22] Filed: May 4, 1994

[51] Int. Cl.$^6$ .................................................. H01L 35/20
[52] U.S. Cl. ........................ 136/239; 136/201; 136/225
[58] Field of Search ................................ 136/201, 225, 136/239

[56] References Cited

U.S. PATENT DOCUMENTS

| | | | |
|---|---|---|---|
| Re. 32,207 | 7/1986 | Levinstein et al. | 427/85 |
| 2,955,145 | 10/1960 | Schrewelius | 136/5 |
| 3,072,733 | 1/1963 | Sasaki et al. | 136/5 |
| 3,767,469 | 10/1973 | Flais et al. | 136/225 |
| 4,275,259 | 6/1981 | Yamamoto et al. | 136/209 |
| 4,276,557 | 6/1981 | Levinstein et al. | 357/67 |
| 4,332,839 | 6/1982 | Levinstein et al. | 427/85 |
| 4,419,023 | 12/1983 | Hager, Jr. | 374/179 |
| 4,500,742 | 2/1985 | Morimoto et al. | 136/206 |
| 4,534,099 | 8/1985 | Howe | 29/572 |
| 4,558,342 | 12/1985 | Sclar | 357/30 |
| 4,587,718 | 5/1986 | Haken et al. | 29/571 |
| 4,665,276 | 5/1987 | Elbel et al. | 136/215 |
| 4,922,822 | 5/1990 | Bierschenk et al. | 136/204 |
| 4,935,345 | 6/1990 | Guilbeau et al. | 435/14 |
| 4,938,244 | 7/1990 | Kumada et al. | 136/212 |
| 5,041,394 | 8/1991 | Spratt et al. | 437/200 |
| 5,152,931 | 10/1992 | Alexander | 252/512 |

OTHER PUBLICATIONS

Perry, Robert H., Consultant, *Chemical Engineers Handbook*, Fifth Ed., 1973, pp. 22–34 through 22–35.
Kreider, "Thin Film High Temperatur Silicide Thermocouples", May 5, 19993, pp. 541–552.

Primary Examiner—Donald P. Walsh
Assistant Examiner—Chrisman D. Carroll
Attorney, Agent, or Firm—Evenson, McKeown, Edwards & Lenahan

[57] ABSTRACT

A high temperature resistant and corrosion resistant thermoelement for a thermocouple formed of a silicon base layer, a conductive thin film of a silicide of a transition metal such as titanium or molybdenum which is stable at temperatures in the range from 800° C. to at least 1000° C., preferably to at least about 1500° C., and an oxygen diffusion limiting silica overlayer, and a method of forming such a thermoelement by depositing a conductive transition metal silicide film over a silicon base layer and heat treating the film in an oxidizing gas atmosphere having a partial pressure of oxidizing gas sufficient to oxidize silicon atoms from the transition metal silicide to form a continuous $SiO_2$ overlayer, but insufficient to oxidize transition metal atoms from the transition metal silicide, in which silicon atoms from the transition metal silicide layer which are oxidized to form the $SiO_2$ overlayer are replaced by silicon atoms from the silicon base layer.

20 Claims, 5 Drawing Sheets

THIN FILM HIGH TEMPERATURE SILICIDE THERMOCOUPLES

BACKGROUND OF THE INVENTION

Thin film thermocouples have several advantages which have led to their use in numerous interesting applications. Their small size and low profile (1 µm) permit temperature measurements in such difficult environments as gas turbine engines and in diesel engine cylinders. The small size of the sensor not only permits excellent spatial resolution, but also permits extremely fast response (1 µs) in measuring the surface temperature of material in contact with hot and corrosive gases. The unique properties of thin film thermocouples combined with their low cost and suitability for automated production has led to wider use and expanding applications.

Many applications, particularly in the aerospace industry, involve high temperature environments where stability and reliability under harsh conditions are principal design considerations. A review of candidate materials for surface temperature measurements up to 1650° C. (3002° F.), which includes a detailed analysis of potential materials and techniques for the measurements together with discussions of some of the compatibility problems, has been published by Bennethum et al., in "Sensors for Ceramic Components in Advanced Propulsion Systems", *NASA Contractor Report 180900*, NASA Lewis Research Center, Cleveland (1988).

The demanding requirements of high temperature, corrosive environments have led to the use of platinum-rhodium alloy thermocouples for their outstanding resistance to oxidation at high temperatures. Recent studies of thin-film platinum/platinum rhodium thermocouples have indicated serious oxidation problems related to rhodium oxidation in the 700°–900° C. range and substrate reactions at temperatures above 1250° C. See Kreider, J. Vac. Sci. Tech., A11 (4) July/August 1993 and Hollanda, *Temperature: Its Measurement and Control in Science and Industry*, Vol. 1, p. 649, Am. Inst. of Physics, N.Y. (1992). The reactivity of the thermoelements is a more profound problem with thin films than with wires because of the very short ($\leq 1$ µm) diffusion distances. What might be a small surface reaction layer on a 0.5 mm (500 µm) wire can consume a 1 µm thick film. In alloy thermocouples the alloying element, for example-Rh, had different reactivities with environmental factors, such as oxygen, sulfur, or silicon, than the platinum and a change in the solute levels leads to changes in the Seebeck coefficient.

Refractory metal silicides have been used commercially in high temperature air furnaces as heating elements and in fixtures. $MoSi_2$ is presently used in the highest temperature commercial electrical heater elements, which are commonly used to 1600° C. in air. Metal silicides have also been considered as possible electrical conductors in integrated circuits, and their properties, thermodynamics, formation and oxidation have been studied, and silicide characteristics and mechanisms are described in the literature in connection with silicide conductors on silicon. See S. P. Murarka, *Silicides for VLSI Applications*, Academic Press, N.Y. (1983).

Flais et al., U.S. Pat. No. 3,767,469, has even proposed the use of $MoSi_2$ as a thermoelement of a thick-film thermocouple, but has to use a sealed reference electrode in order to eliminate the effects of oxygen migration.

Despite the efforts of the prior art, there has remained a need for improved thin film thermocouples which can be used particularly in high temperature environments and/or under oxidative and/or corrosive conditions.

SUMMARY OF THE INVENTION

It is the object of the present invention to provide an improved thermoelement for a thin film thermocouple.

Another object of the invention is to provide a thin film thermoelement which can be used in a high temperature environment.

A further object of the invention is to provide a thin film thermoelement which exhibits improved oxidation and corrosion resistance.

It is an additional object of the invention to provide a process for preparing an improved thin film thermocouple.

These and other objects of the invention are achieved by providing a thermocouple comprising a first conductive thermoelement extending between a measurement junction and a reference junction and a dissimilar second conductive thermoelement extending between the measurement junction and the reference junction, the first and second thermoelements having different electrical resistivities and being in electrical communication with each other only at the measurement junction and at the reference junction, in which at least one of the first and second thermoelements comprises a conductive transition metal silicide film disposed on a silicon base layer and covered by an oxygen diffusion limiting $SiO_2$ overlayer.

If one of the thermoelements is not composed of a conductive transition metal silicide film disposed on a silicon base layer and covered by an oxygen diffusion limiting $SiO_2$ overlayer, then it may, for example, comprise pure platinum, which has been found to be stable at high temperatures in air. Alternatively, if the object whose temperature is being measured is an electrical conductor (such as a gas turbine blade, vane, etc.), then the object itself may serve as the second thermoelement.

In accordance with a further aspect of the invention, the objects are achieved by providing a method of preparing a metal silicide thermoelement for a thermocouple comprising the steps of providing a silicon base layer between a thermocouple measurement junction and a thermocouple reference junction; applying a transition metal silicide film over the base layer between the measurement junction and the reference junction; and heat treating the transition metal silicide film under an oxidizing gas atmosphere to form a continuous $SiO_2$ overlayer on the film, the atmosphere having a partial pressure of oxidizing gas sufficient to oxidize silicon atoms from the transition metal silicide film to $SiO_2$ but insufficient to oxidize transition metal atoms from said transition metal silicide film, and in which Si atoms from the transition metal silicide film which are oxidized to $SiO_2$ are replaced in the film by Si atoms from the silicon base layer.

The advantages of transition metal silicides include high temperature stability during processing, compatibility with silicon, and good electrical conductivity. The stability of transition metal silicides in oxidizing atmospheres up to 1500° C. and excellent electrical conductivity make them particularly useful as thin film sensors in harsh environments.

The invention enables fabrication of thin film thermocouples which are extremely stable in hot oxidizing atmospheres and in highly corrosive aqueous environments. The invention further comprises a method for producing such thin film thermocouples and a unique and necessary composite structure which permits stable electrical output while the thin film thermocouple is exposed to harsh corrosive and oxidative conditions.

The method of preparation of the thin film thermoelements of the invention comprises depositing thin films of conductive transition metal silicide on a substrate. The thickness of the films may range from about 0.1 μm to about 5 μm or more. Preferably the film thickness will lie in the range from about 0.5 μm to about 3 μm, particularly preferably between about 1 μm and about 2 μm. The thin films may be deposited by any known technique which produces a continuous, conductive film. Good results have been obtained by sputter deposition, but other deposition techniques, such as laser ablation or evaporative techniques, could also be used. Sputtering may be effected using a single stoichiometric target or by co-sputtering separate transition metal and silicon targets. Any suitable substrate may be used. Good results have been obtained using alumina substrates with $TiSi_2$ and $MoSi_2$ thin films because the thermal expansion coefficients of the alumina and the films are sufficiently close that thermal cracking of the films does not occur upon heating and cooling. Persons skilled in the art can readily match the expansion coefficients of any transition metal silicide and substrate by simple routine experimentation.

Prior to depositing the transition metal silicide thin film, a layer of silicon is first deposited on the substrate (assuming a substrate other than silicon is used). This silicon base or underlayer serves as a feeder layer to supply silicon atoms to the transition metal silicide layer to replace those consumed in forming the protective $SiO_2$ overlayer, thereby preventing consumption of the metal silicide layer. The silicon underlayer also may be deposited by any suitable technique. For example, good results have been obtained by sputtering. The silicon feeder layer beneath the transition metal silicide layer assures that the silicide layer will undergo slow parabolic and stable oxidation.

The protective $SiO_2$ overlayer is grown by heat treating the transition metal silicide layer in a suitable atmosphere comprising an oxidizing gas. The partial pressure of the oxidizing gas must be sufficiently high to oxidize silicon atoms from the metal silicide layer to form a continuous $SiO_2$ overlayer, but not so high that atoms of the transition metal will be appreciably oxidized. In the present invention it is particularly preferred to use an atmosphere of argon or a mixture of argon and hydrogen. Although such atmospheres are usually regarded to be reducing atmospheres, they typically contain a partial pressure of water vapor on the order of $10^{-4}$ to $10^{-5}$ atmospheres, which is sufficient to oxidize silicon atoms from the metal silicide layer at elevated temperatures. This amount of water vapor is not, however, sufficient to oxidize appreciable amounts of transition metal atoms from the metal silicide layer.

One of the most desirable materials for high temperature measurements in oxidizing environments is molybdenum disilicide ($MoSi_2$). Although $MoSi_2$ oxidizes in air the surface can be protected with a self-healing silicon dioxide ($SiO_2$) diffusion barrier which limits oxygen diffusion to the silicide. $MoSi_2$ is a line compound with very small solubilities for excess silicon or molybdenum, and it exhibits a stable Seebeck coefficient unaffected by changes in composition. The melting point of 1980° C. is very high and the thermal expansion coefficient is similar to aluminum oxide $Al_2O_3$. Because of these attributes, $MoSi_2$ is especially preferred as a high temperature thin film thermocouple element.

Titanium disilicide $TiSi_2$ and tantalum disilicide $TaSi_2$ have comparable or slower oxidation rates than $MoSi_2$ and also appear promising as thin film thermoelements. $TiSi_2$ has been produced with less than 20 μΩ cm resistivity compared with $MoSi_2$ (100 μΩ cm) and $TaSi_2$ (50 μΩ cm), These conductivities are useful in thin films to avoid high impedances in the thermoelements. In contrast, silicon carbide SiC typically has $10^5$ μΩ cm and has to be heavily doped to be useful as a thin film conductor.

BRIEF DESCRIPTION OF THE DRAWINGS

The invention will be described hereinafter with reference to illustrative preferred embodiments and the accompanying drawings in which.

DETAILED DESCRIPTION OF PREFERRED EMBODIMENTS

For ease of explanation, the following description will refer to illustrative examples of conductive transition metal silicide thermoelements formed of molybdenum silicide and titanium silicide, but it should be understood that these descriptions are merely exemplary, and that the thermoelements of the invention may comprise any conductive transition metal silicide which is stable at temperatures from about 800° C. to at least about 1000° C., preferably up to about 1500° C.

EXPERIMENTAL PROCEDURES

We have investigated sputter deposited $TiSi_2$, $MoSi_2$, $WSi_2$, and $TaSi_2$ thin films and characterized their performance and stability at temperatures up to 1200° C. Particularly promising results were obtained with sputtered thin film $MoSi_2$, and $TiSi_2$ thermocouples. In order to demonstrate the feasibility of these high temperature thin-film silicide thermocouples, 1–2 μm films were sputter deposited on $Al_2O_3$ ceramic substrates. In addition, in order to supply silicon to grow the protective $SiO_2$ outer layer on the silicides, a sputtered layer of silicon was deposited on the alumina prior to the silicide deposition. After fabrication and suitable heat treatments, the samples were tested for thermoelectric output and changes in resistivity.

Silicide films 1–2 μm thick were sputtered from stoichiometric targets 99.5% $TaSi_2$, 99.5% $TiSi_2$ and 99.5 $MoSi_2$.

Principal impurities are oxygen and metals, and alkali and alkaline earth elements are in the 2–5 ppm range. Sputtering was performed with radio frequency (RF) planar magnetrons at 100 W on a 5 cm target, 8–10 cam from the substrate. Sputtering pressures were held to 0.3 Pa of argon to minimize the tensile stresses on the films which are probably due to compound formation in the growing film. Substrate temperature was held at 120° C. to minimize incorporation of adsorbed gases ($H_2O$, etc) in the film. Before silicide film deposition, aa 0.4 μm silicon film was sputtered deposited on the $Al_2O_3$ substrate film. The silicon target was 99.9999% pure and sputtered under the same conditions.

Heat treatments were performed in an SiC electrically heated tube furnace in Ar (4% $H_2$), Ar, and in air. In growing the $SiO_2$ surface layer, the silicide was heated to 900° C. in argon before exposing it to air to suppress metal oxide formation.

Figure 1:
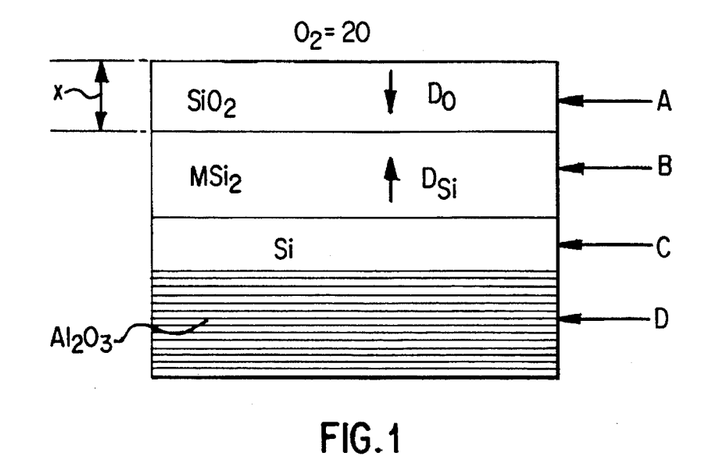
FIG. 1 is a schematic illustration of the composite structure of a thin film thermoelement according to the present invention.

The composite structure of the thin film thermoelement according to the invention is schematically illustrated in FIG. 1. The composite comprises a substrate D, for example an alumina substrate, on which a silicon feeder layer C has been deposited. A transition metal silicide layer B is deposited over the silicon base layer, and then a protective $SiO_2$ overlayer is grown on top of the metal silicide layer by heat treatment in an appropriate oxidizing atmosphere as described above. As shown by the arrow $D_{Si}$ the silicon feeder layer C provides silicon through the stable metal silicide layer in order to generate the self-healing protective layer of silicon dioxide A without altering the thermoelectric potential of the transition metal silicide layer. The growth rate of the oxide layer A in thickness (indicated by dimension "x") is limited by the need for oxygen to diffuse through the $SiO_2$ layer as indicated by the arrow $D_o$ and slows as "x" increases. The successive deposition of the silicon C and transition metal silicide B layers on the substrate D, followed by growth of the protective $SiO_2$ layer A yields temperature sensor which is characterized by fast response, small size, and durability even under harsh, corrosive, oxidative conditions.

Resistivity measurements of the films were made with an osmium (Os) four-point probe. Thermoelectric measurements were made in a specially designed furnace with a comparison to a reference grade ANSI Type S (platinum, platinum-10% rhodium) thermocouple. The specimen on the alumina substrate was 12 cm long between the water cooled reference junction and the measuring junction.

Figure 2:
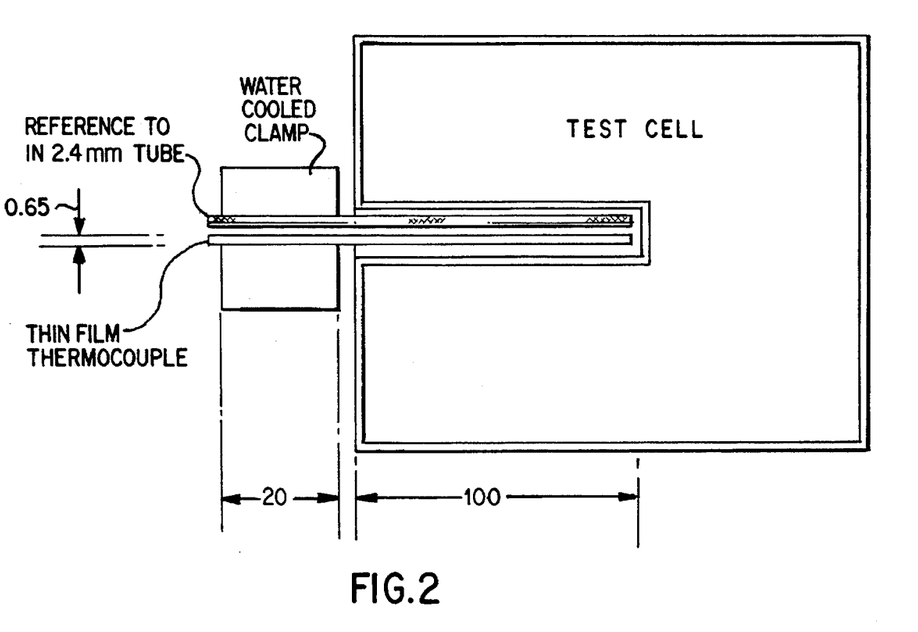
FIG. 2 is a schematic illustration of a test cell used to test the thin film thermoelements according to the invention and the thermoelements.

The configuration of the test cell and the thin film silicide thermoelements are depicted in FIG. 2. Two configurations of the test specimen were used in comparing the thin-film silicide to platinum. Both employed the 10×120 mm alumina substrate. One comprised thin film platinum and silicide elements. The other employed a platinum wire clamped to the measuring junction. The specimen on the alumina substrate was 120 mm long to reach from the water cooled reference junction to the measuring junction.

RESULTS OF TESTING

Ten thermocouple test coupons were fabricated from the stoichiometric titanium disilicide ($TiSi_2$) target with a 0.4 μm silicon layer underneath. Typical results of the thermoelectric output test versus a platinum wire are given in FIG. 4. This test specimen was annealed in Ar (4% $H_2$) for one-half hour and shows no loss in Seebeck coefficient. A summary of the results in testing the thermoelectric output of the $TiSi_2$ samples is presented in Table 1. The results are presented both as coefficients to a least squares fit of second degree and as the Seebeck coefficient, $S_{500}$, calculated at 500° C. Where E, the thermoelectric output, in volts can be expressed:

$$E = AT + B/1000\ T^2 + C$$

and S, the Seebeck coefficient, in volts per °C.:

$$S = A + B/500\ T.$$

Figure 4:
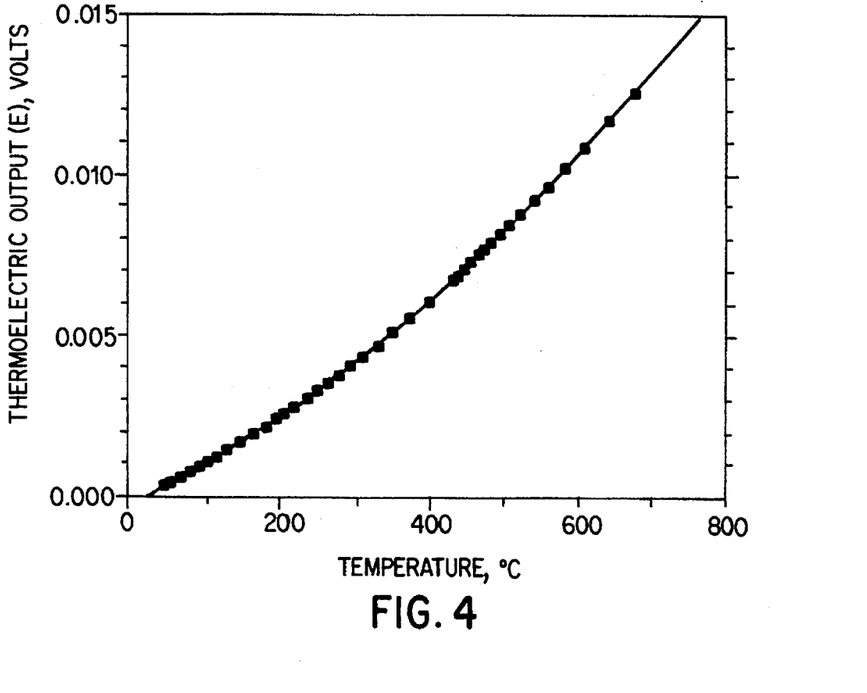
FIG. 4 is a graph of the thermoelectric output of a sputtered TiSi2 thin film after ½ half hour at 800° C. in argon/4% hydrogen versus a platinum thermoelement.
Figure 5:
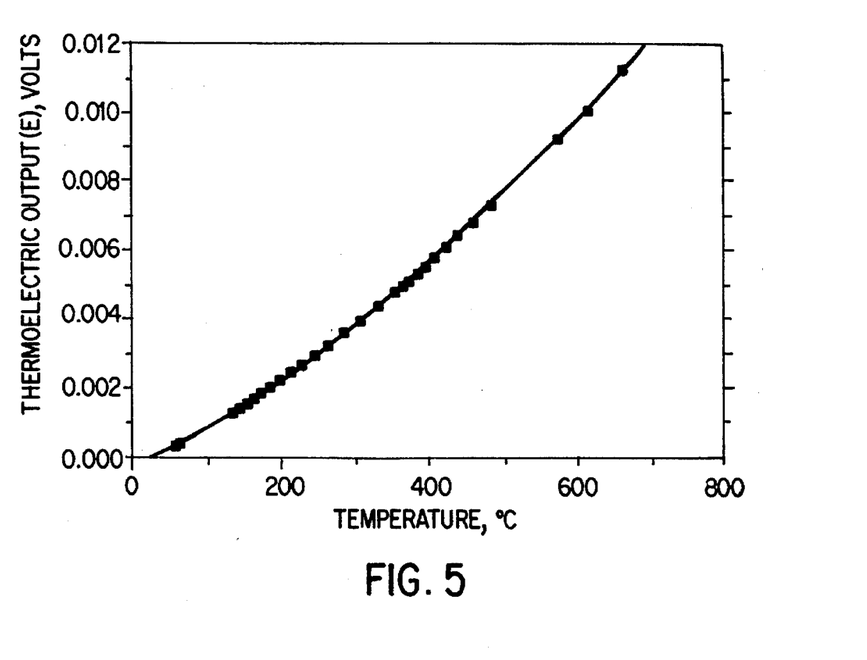
FIG. 5 is a graph of the thermoelectric output of a sputtered $TiSi_2$ 1.5 μm thin film after three hours at 1200° C. in air versus a platinum thermoelement.

FIG. 4 is typical of the excellent fit obtained using the second degree polynomial. The most interesting aspect of the $TiSi_2$ results is that the Seebeck coefficient is unaffected by heat treatments up to 1200° C. which is an indication of its stability during oxidation. FIG. 5 displays the results after 3 hours at 1200° C. (in air). An expected variation of ±10% is observed in the reported values.

Based on the previous results of measurements of $TiSi_2$ thin film oxidation by Strydom et al., *Thin Solid Films*, Vol. 131, pp. 215–31 (1985), the expected values of oxide thickness would be approximately 300–400 nm after 3 hours at temperatures up to 1100° C. in dry oxygen and 800–900 nm after 20 hours at 1100° C. Using the activation energy of 1.3 eV for the parabolic rate constant (measured in oxygen) which is similar to that of silicon, one can also calculate the thickness expected at 1200° C., etc. This activation energy is related to the diffusion of oxygen through $SiO_2$ and limits the rate if metal oxidation is suppressed. The expected thickness generated in oxygen after 3 hrs. at 1200° C. would be approximately 600 nm. After 20 hours at 1200° C. a major fraction of the silicon and silicide will have been converted to $SiO_2$. A thicker silicon layer would be needed if more severe oxidative exposure were anticipated. The silicide film resistivity at room temperature for this exposure is also reported in Table 1. These are average values and the errors in the four point measurement technique and thickness measurements are estimated at less than 20% of the reported value. Multiple samples and tests all fall within these limits. It is apparent that the final high conductivity phase of the $TiSi_2$ us not mature until heat treatments comparable to 3 hours at 1000° C. are performed. At the highest temperature and longest time, apparently the loss of material is severely affecting the resistivity.

Figure 3A:
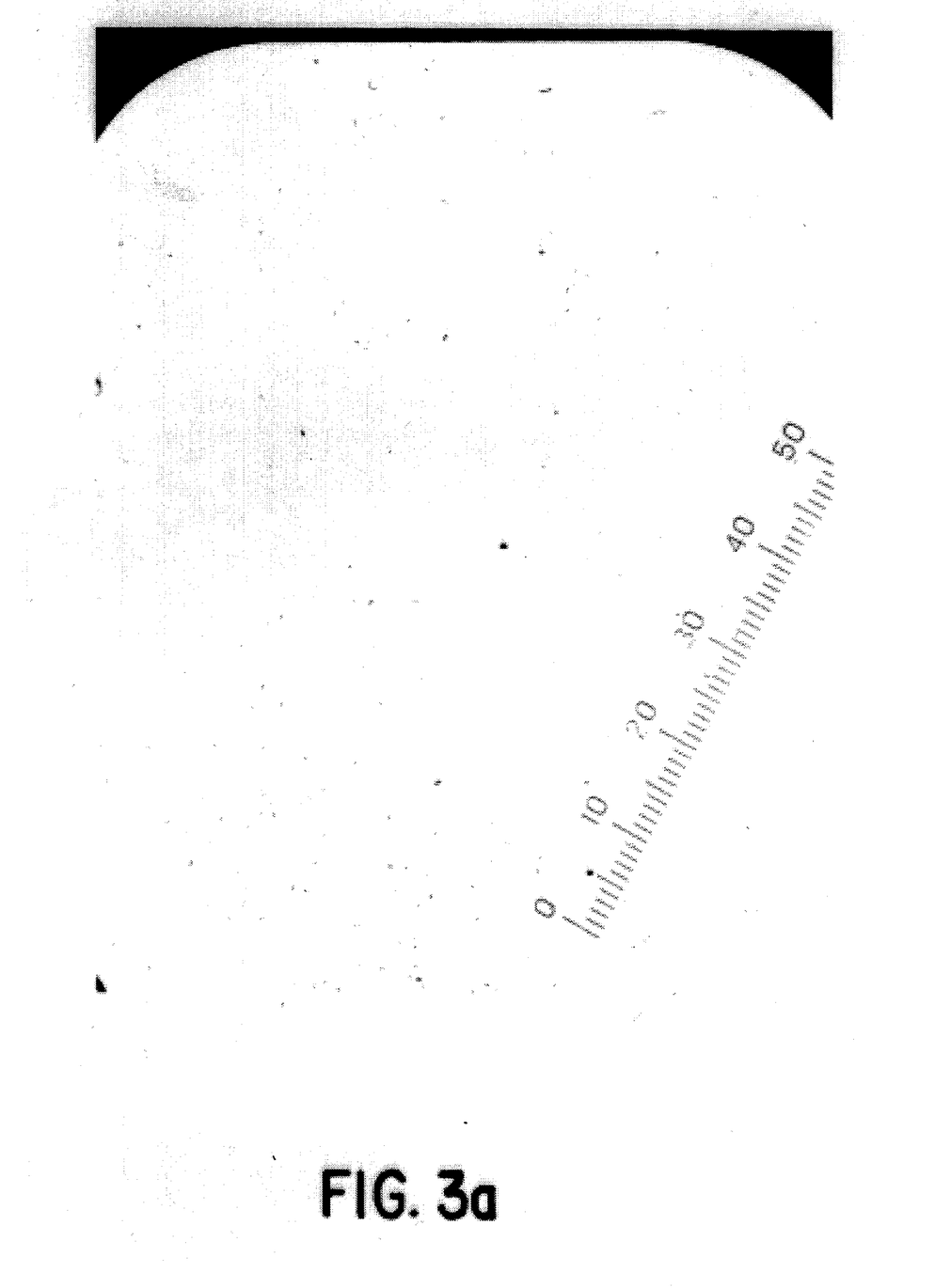
FIGS. 3a and 3b are photomicrographs of oxide growth on a $TiSi_2$ thin film before and after exposure for 20 hours to air at 1200° C.
Figure 3B:
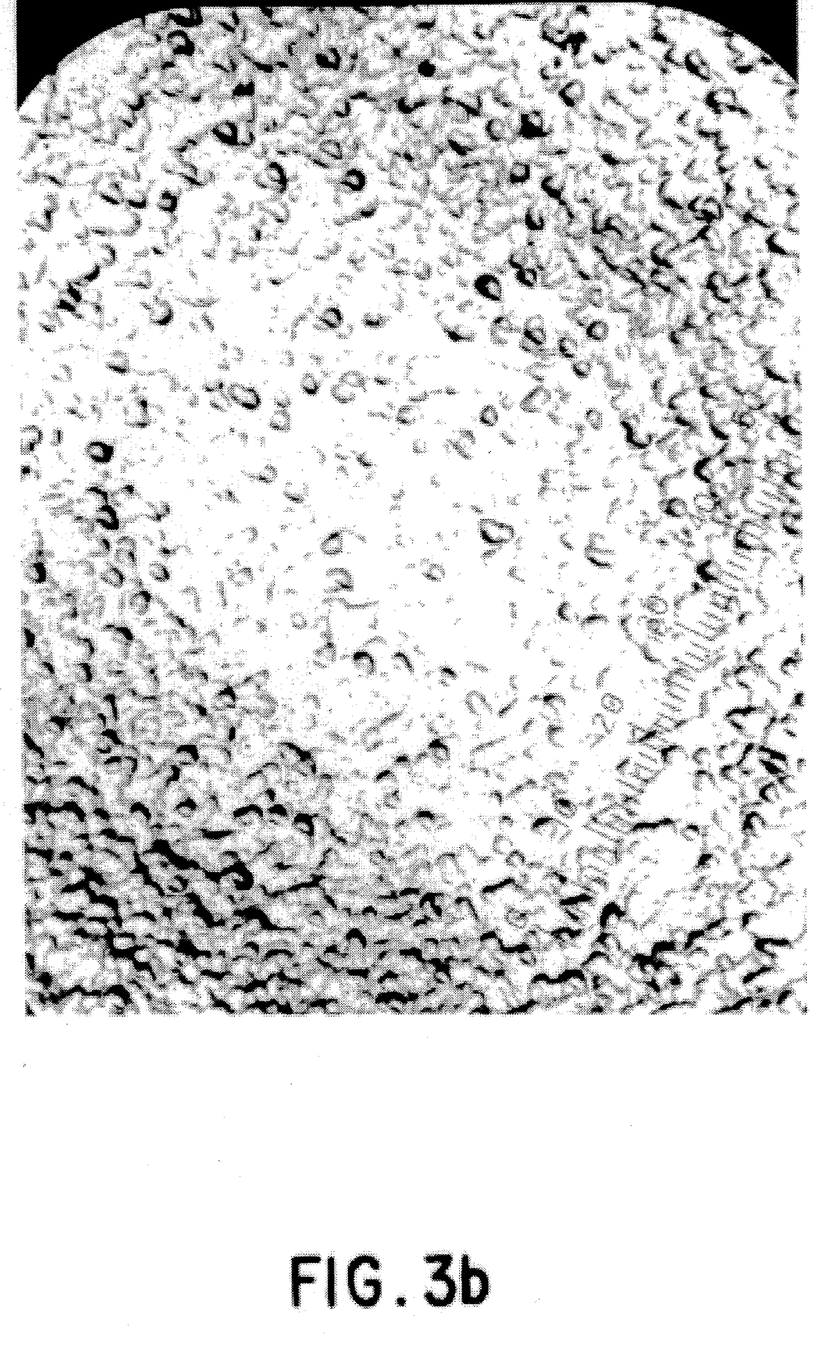

In order to determine the morphology of the oxide growth, the $TiSi_2$ was also deposited on silicon. FIGS. 3a and 3b show 60x photomicrographs of the oxide on the $TiSi_2$ before and after 20 hours at 1200° C. in air. Note the irregular morphology of the oxide growth compared with the featureless thin film as deposited.

TABLE 1

| | | $TiSi_2$ Thermoelectric Output | | | |
|---|---|---|---|---|---|
| Heat Treatment | | Resistivity | A | B/1000 | $S_{500}$ |
| (°C.) | (Hr.) | (μ Ω cm) | (μV/°C.) | (μV/°C.$^2$) | (μV/°C.) |
| 800 | ½* | | 11.5 | 10.8 | 22.3 |
| 900 | ½* | 200 | 9.1 | 10.7 | 19.8 |
| 800 | 3 | 45 | 8.5 | 11.1 | 19.6 |
| 1000 | 3 | 20 | 9.9 | 11.8 | 21.7 |
| 1000 | 20 | 23 | 9.2 | 11.6 | 20.8 |
| 1100 | 3 | 20 | 10.1 | 10.8 | 21.9 |
| 1200 | 3 | 24 | 10.8 | 10.0 | 20.8 |
| 1200 | 20 | 100 | | | |

*In Ar-4% $H_2$; others in air

Figure 6:
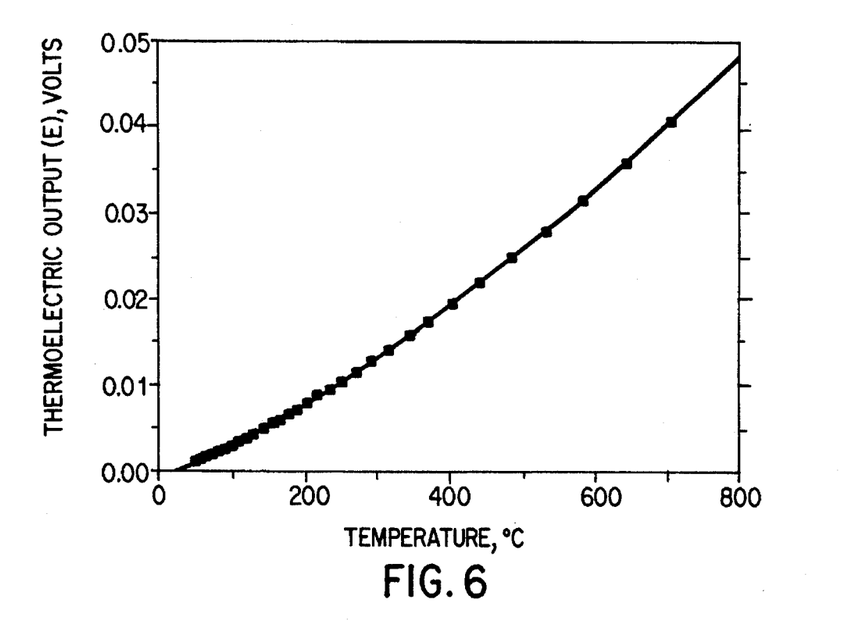
FIG. 6 is a graph of the thermoelectric output of a sputtered $MoSi_2$ thin film after ½ half hour at 800° C. in argon/4% hydrogen versus a platinum thermoelement.
Figure 7:
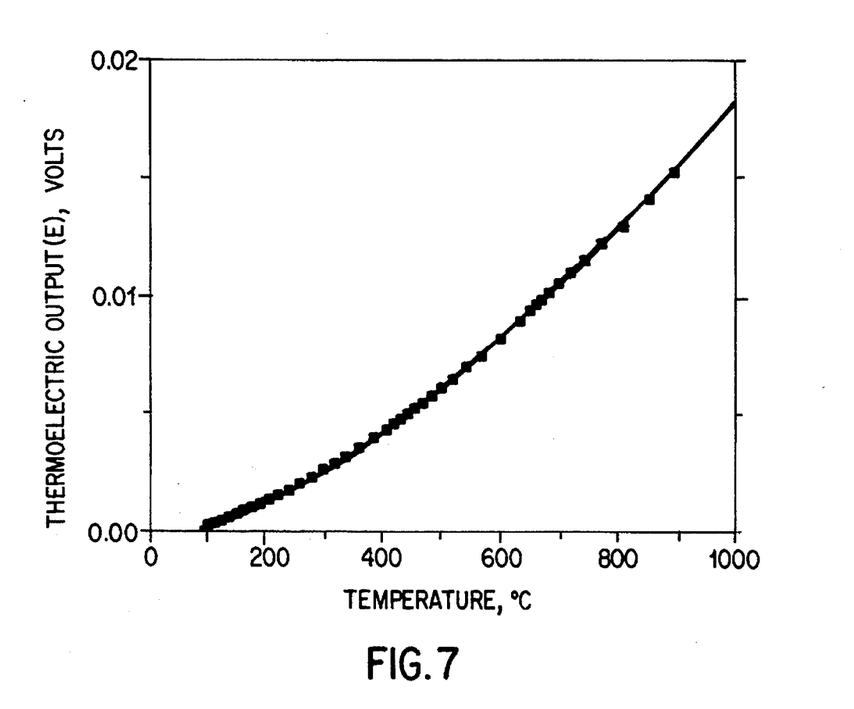
FIG. 7 is a graph of the thermoelectric output of a sputtered $MoSi_2$ 1.6 μm thin film after three hours at 1200° C. in air versus a platinum thermoelement.

The results of testing nine thin-film thermocouples of $MoSi_2$ are presented in Table 2 and FIGS. 6 and 7. The Seebeck coefficients and resistivities for multiple samples are averaged for the table. FIG. 6 displays the thermoelectric output of the MoSi$_2$ film after the Ar 4% H$_2$ anneal at 800° C. The high output (S$_{500}$ =69 μmV/°C.) indicates that the final stoichiometry and morphology are not achieved at that point (900° C.). Notice in Table 2 that the resistivity is also high. The performance of the MoSi$_2$ film after three hours at 1200° C. is shown in FIG. 7. The resistivity measurements correspond to the thermoelectric measurements. It is apparent that the high conductivity phase is not completed until the sputtered compound is annealed above 800° C. and that brief annealing in a reducing atmosphere at 900° C. is not adequate. The MoSi$_2$ results are similar to those of the TiSi$_2$ and the thermoelectric output versus pure platinum is not modified by the development of the oxide even after three hours at 1200° C. The oxide developed was found to be substantially SiO$_2$ by X-ray photoelectron spectroscopy (XPS) as the Mo signal was suppressed complete after a 900° C. anneal in air. The XPS results indicated small amounts of TiO$_2$ on the TiSi$_2$ after a similar heat treatment. These results correspond to earlier results [See Chen et al., Appl. Phys. Lett., Vol. 37, p. 824 (1980) and d'Heurle et al., J. Appl. Phys., Vol. 54, p 2716 (1983)] and relate to the refractive nature of TiO$_2$ which forms before the SiO$_2$ layer is complete and the volatile nature of molybdenum oxide MoO$_3$ which is lost as it forms. The oxidation treatment used with the silicide, using as Ar (4% H$_2$) below 900° C., minimized low temperature, slow oxidation of the metal and favored the formation of SiO$_2$.

In addition to the MoSi$_2$ the same procedures were used to grow TaSi$_2$. The tantalum silicide yielded similar results to the TiSi$_2$ when annealed in argon plus 4% hydrogen, resulting in S$_{500}$=22 μV/°C.; however, the film lost electrical conductivity when annealed in air above 900° C. for 20 hours. A heavy oxide growth on the TaSi$_2$ may indicate the TaSi$_2$ film on the Al$_2$O$_3$ substrate was being damaged by a thermal expansion mismatch.

TABLE 2

| | MoSi$_2$ Thermoelectric Output | | | |
|---|---|---|---|---|
| Heat Treatment | Resistivity | A | B/1000 | S$_{500}$ |
| (°C.) (Hr.) | (μ Ω cm) | (μV/°C.) | (μV/°C.$^2$) | (μV/°C.) |
| 800 ½* | 800 | 28.1 | 36.0 | 64.1 |
| 900 ½* | 500 | 38.8 | 29.8 | 68.6 |
| 800 3 | | 36.6 | 29.6 | 66.2 |
| 900 3 | 100 | 10.3 | 11.1 | 21.4 |
| 1000 3 | 100 | 7.8 | 12.0 | 19.8 |
| 1000 20 | 100 | 8.3 | 12.0 | 20.3 |
| 1100 3 | 100 | 8.3 | 11.5 | 19.8 |
| 1200 3 | 120 | 8.0 | 11.4 | 19.4 |

*In Ar-4% H$_2$; others in air

Both MoSi$_2$ and TiSi$_2$ show promise as thermoelements in high temperature thin film thermocouples. Their resistance to oxidation damage is related to the slow parabolic rate of growth of the thickness of SiO$_2$ which is limited by oxygen diffusion. The foregoing results are in general agreement with studies in the electronic industry on the oxidation of these silicides which have characterized the activation energy for the diffusion and the kinetics of oxide growth, and demonstrate the feasibility of using the TiSi$_2$ and MoSi$_2$ on Al$_2$O$_3$ substrates as thin film thermocouples. We have investigated exposures of the silicides to air at temperatures as high as 1200° C. and found the thermoelectric output to be stable. Without being bound to any theory, it is believed that this results from the fact that both silicides are "line" compounds and therefore have very little solubility for excess silicon or metal which would modify their thermoelectric potential. The results also indicate that the Seebeck coefficient is not diminished by loss of material since in contrast to the electrical resistance, thermoelectric voltage is not a function of film thickness. Therefore, the outstanding corrosion resistance of this film thermocouples formed of conductive transition metal silicides, such as TiSi$_2$ and MoSi$_2$, may lead to numerous applications where metal thermocouples are vulnerable to deterioration.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of preparing a metal silicide thermoelement for a thermocouple, said method comprising the steps of:

providing a silicon base layer extending from a thermocouple measurement junction to a thermocouple reference junction;

applying a transition metal silicide film over said base layer between said measurement junction and said reference junction; and heat treating said metal silicide film under an oxidizing gas atmosphere to form a continuous SiO$_2$ overlayer on said film, said atmosphere having a partial pressure of oxidizing gas sufficient to oxidize silicon atoms from said metal silicide film to SiO$_2$ but insufficient to oxidize transition metal atoms from said metal silicide film, whereby silicon atoms from said metal silicide film which are oxidized to SiO$_2$ are replaced in said film by silicon atoms from said silicon base layer.

2. A method according to claim 1, wherein said transition metal silicide is molybdenum silicide or titanium silicide.

3. A method according to claim 1, wherein said metal silicide film is deposited by sputtering a metal silicide target.

4. A method according to claim 1, wherein said metal silicide film is deposited by co-sputtering a transition metal target and a silicon target.

5. A method according to claim 1, wherein said metal silicide film has a thickness of from about 0.1 μm to about 5 μm.

6. A method according to claim 5, wherein said metal silicide film has a thickness of from about 0.5 μm to about 3 μm.

7. A method according to claim 1, wherein said oxidizing gas atmosphere comprises argon or hydrogen and argon containing about 10$^{-2}$ atm. partial pressure of water vapor.

8. A method according to claim 1, wherein said heat treating step is carried out at a temperature of from about 800° C. to about 1500° C. for a time from about ⅙ hour to about 3 hours.

9. A method according to claim 8, wherein said heat treating step is carried out at a temperature of from about 900° C. to about 1200° C. for a time from about ½ hour to about 2 hours.

10. A method according to claim 1, wherein said silicon base layer is provided by sputter depositing a silicon layer having a thickness of from about 0.3 μm to about 3 μm on an alumina substrate.

11. A high temperature and corrosion resistant thermocouple comprising a first conductive thermoelement extending between a measurement junction and a reference junction and a dissimilar second conductive thermoelement extending between said measurement junction and said reference junction, said first and second thermoelements having different electrical resistivities and being in electrical communication with each other only at said measurement junction and at said reference junction, wherein at least one of said first and second thermoelements comprises a conductive transition metal silicide film disposed on a silicon base layer and covered by an oxygen diffusion limiting $SiO_2$ overlayer, said at least one thermoelement being stable at temperatures up to at least about 1,000° C.

12. A thermocouple according to claim 11, wherein said transition metal silicide is molybdenum silicide or titanium silicide.

13. A thermocouple according to claim 11, wherein said transition metal silicide film has a thickness of from about 0.1 μm to about 5 μm.

14. A thermocouple according to claim 13, wherein said transition metal silicide film has a thickness of from about 0.5 μm to about 3 μm.

15. A thermocouple according to claim 11, wherein said conductive transition metal silicide film has a resistivity of from 5 μΩcm to about 500 μΩcm.

16. A thermocouple according to claim 11, wherein said silicon base layer is formed by sputter depositing a silicon layer on an alumina substrate.

17. A thermocouple according to claim 11, wherein said first thermoelement comprises a conductive film of a transition metal silicide, and second conductive thermoelement comprises a conductive film of a different transition metal silicide.

18. A thermocouple according to claim 11, wherein said first thermoelement comprises a conductive film of a transition metal silicide, and said second thermoelement comprises a film of a conductive metal selected from the group consisting of gold, silver, platinum, palladium, iridium, rhodium and alloys thereof.

19. A thermocouple according to claim 11, wherein said first thermoelement comprises a conductive film of a transition metal silicide, and said second thermoelement comprises conductive substrate, the temperature of which is measured by the thermocouple.

20. A high temperature and corrosion resistant thermocouple comprising a first conductive thermoelement extending between a measurement junction and a reference junction and a dissimilar second conductive thermoelement extending between said measurement junction and said reference junction, said first and second thermoelements having different electrical resistivities and being in electrical communication with each other only at said measurement junction and at said reference junction, wherein at least one of said first and second thermoelements comprises a conductive transition metal silicide film produced by providing a silicon base layer extending from said measurement junction to said reference junction;

applying a transition metal silicide film over said base layer between said measurement junction and said reference junction; and heat treating said metal silicide film under an oxidizing gas atmosphere to form a continuous $SiO_2$ overlayer on said film, said atmosphere having a partial pressure of oxidizing gas sufficient to oxidize silicon atoms from said metal silicide film to $SiO_2$ but insufficient to oxidize transition metal atoms from said metal silicide film, whereby silicon atoms from said metal silicide film which are oxidized to $SiO_2$ are replaced in said film by silicon atoms from said silicon base layer.

* * * * *